(12) United States Patent
Uto et al.

(10) Patent No.: US 10,217,887 B2
(45) Date of Patent: Feb. 26, 2019

(54) CRYSTALLINE SILICON-BASED SOLAR CELL, CRYSTALLINE-SILICON SOLAR CELL MODULE, AND MANUFACTURING METHODS THEREFOR

(71) Applicant: KANEKA CORPORATION, Osaka-shi, Osaka (JP)

(72) Inventors: Toshihiko Uto, Settsu (JP); Daisuke Adachi, Settsu (JP); Hisashi Uzu, Settsu (JP)

(73) Assignee: KANEKA CORPORATION, Osaka-shi, Osaka (JP)

(*) Notice: Subject to any disclaimer, the term of this patent is extended or adjusted under 35 U.S.C. 154(b) by 66 days.

(21) Appl. No.: 15/308,030

(22) PCT Filed: Apr. 9, 2015

(86) PCT No.: PCT/JP2015/061160
§ 371 (c)(1),
(2) Date: Oct. 31, 2016

(87) PCT Pub. No.: WO2015/166780
PCT Pub. Date: Nov. 5, 2015

(65) Prior Publication Data
US 2017/0084772 A1   Mar. 23, 2017

(30) Foreign Application Priority Data

May 2, 2014   (JP) .................. 2014-095543

(51) Int. Cl.
*H01L 31/0747* (2012.01)
*H01L 31/0216* (2014.01)
(Continued)

(52) U.S. Cl.
CPC .... *H01L 31/0747* (2013.01); *H01L 31/02167* (2013.01); *H01L 31/022425* (2013.01);
(Continued)

(58) Field of Classification Search
CPC ........... H01L 31/0747; H01L 31/02167; H01L 31/022466
See application file for complete search history.

(56) References Cited

U.S. PATENT DOCUMENTS

| 5,935,344 A | 8/1999 | Endo et al. |
| 2015/0075601 A1 | 3/2015 | Adachi et al. |
| 2015/0270422 A1 | 9/2015 | Uzu et al. |

FOREIGN PATENT DOCUMENTS

| EP | 2450970 A1 | 5/2012 |
| JP | H09129904 A | 5/1997 |

(Continued)

OTHER PUBLICATIONS

International Bureau of WIPO, International Preliminary Report on Patentability Issued in Application No. PCT/JP2015/061160, dated Nov. 17, 2016, WIPO, 8 pages.
(Continued)

*Primary Examiner* — Errol Fernandes
(74) *Attorney, Agent, or Firm* — Alleman Hall Creasman & Tuttle LLP

(57) ABSTRACT

The crystalline silicon-based solar cell includes a first intrinsic silicon-based thin-film, a p-type silicon-based thin-film, a first transparent electrode layer, and a patterned collecting electrode on a first principal surface of an n-type crystalline silicon substrate; and a second intrinsic silicon-based thin-film, an n-type silicon-based thin-film, a second transparent electrode layer, and a plated metal electrode on a second principal surface of the n-type crystalline-silicon substrate. On a peripheral edge of the first principal surface, an insulating region freed of a short-circuit between the first transparent electrode layer and the second transparent electrode layer is provided. The plated metal electrode is formed on an entire region of the second transparent electrode layer.

4 Claims, 4 Drawing Sheets

(51) Int. Cl.
*H01L 31/0224* (2006.01)
*H01L 31/0352* (2006.01)
*H01L 31/05* (2014.01)
*H01L 31/18* (2006.01)

(52) U.S. Cl.
CPC ........... *H01L 31/022466* (2013.01); *H01L 31/03529* (2013.01); *H01L 31/0504* (2013.01); *H01L 31/1804* (2013.01); *Y02E 10/547* (2013.01); *Y02P 70/521* (2015.11)

(56) References Cited

FOREIGN PATENT DOCUMENTS

| | | | |
|---|---|---|---|
| JP | 2013058702 | A | 3/2013 |
| WO | 2013001861 | A1 | 1/2013 |
| WO | 2013161127 | A1 | 10/2013 |
| WO | 2014054600 | A1 | 4/2014 |

OTHER PUBLICATIONS

European Patent Office, Extended European Search Report Issued in European Application No. 15785959.6, dated Dec. 19, 2017, Germany, 9 pages.
ISA Japan Patent Office, International Search Report Issued in Application No. PCT/JP2015/061160, dated Jun. 16, 2015, WIPO, 3 pages.

CRYSTALLINE SILICON-BASED SOLAR CELL, CRYSTALLINE-SILICON SOLAR CELL MODULE, AND MANUFACTURING METHODS THEREFOR

TECHNICAL FIELD

The invention relates to a crystalline silicon-based solar cell having a heterojunction on a crystalline silicon substrate surface, a crystalline silicon-based solar cell module, and manufacturing method therefor.

BACKGROUND ART

A crystalline silicon-based solar cell including a conductive silicon-based thin-film on a single-crystalline silicon substrate is called a heterojunction solar cell. Particularly, a heterojunction solar cell including an intrinsic amorphous silicon thin-film between a conductive silicon-based thin-film and a crystalline silicon substrate is known as one of forms of crystalline silicon-based solar cells having the highest conversion efficiency.

A heterojunction solar cell includes silicon-based thin-film of opposite-conductivity-type on the light-receiving side of a crystalline silicon substrate of first conductivity-type, and silicon-based thin-film of first conductivity-type on the back side of the crystalline silicon substrate of first conductivity-type. Generally, an n-type single-crystalline silicon substrate is used, and a p-type silicon-based thin-film is formed on the light-receiving side thereof, while an n-type silicon-based thin-film is formed on the back side thereof. Carriers generated at these semiconductor junction portions are extracted outside of a solar cell via an electrode. As the electrode, a combination of a transparent electroconductive layer and a metal collecting electrode is generally used.

Since the metal collecting electrode shields light, a line-shape patterned metal collecting electrode is used on the light-receiving side for enlarging the light-receiving area of the solar cell. On the other hand, an attempt has been made to improve light utilization efficiency by a method in which a metal electrode is formed on the entire surface on the back side, and light that has been transmitted without being absorbed by a crystalline silicon substrate is reflected by the metal electrode on the back side to reenter into the crystalline silicon substrate. For example, Patent Document 1 discloses a heterojunction solar cell in which a patterned collecting electrode is formed on the light-receiving side of the solar cell by a plating method, and a silver electrode is formed on the entire surface on the back side of the solar cell by a sputtering method. Patent Document 2 discloses a heterojunction solar cell in which a metal electrode is formed on the entire surface on the back side by electroplating. In electroplating, a metal electrode having a large thickness can be easily formed, and therefore improvement of characteristics and productivity by reduction of the resistance of the metal electrode can be expected.

PRIOR ART DOCUMENT

Patent Documents

Patent document 1: International Publication No. WO 2013/161127
Patent document 2: International Publication No. WO 2013/001861

SUMMARY OF THE INVENTION

Problems to be Solved by the Invention

As disclosed in Patent Document 1, it is known that in production of a heterojunction solar cell, a silicon-based thin-film and a transparent electrode layer are also formed on the side surface of a silicon substrate and a surface opposite to a deposition surface by wraparound, so that a short-circuit between transparent electrodes on the front and the back generates. When a metal electrode is formed on the back side by electroplating in a state in which the electrodes on front and back are short-circuited, a metal layer is also precipitated on the light-receiving side to generate a new leakage pass, a shading loss and so on. Thus, it is necessary to eliminate a short-circuit between transparent electrode layers on the front and the back before forming a metal electrode by electroplating.

The present inventors have conducted studies, and found that when a metal electrode is formed on the back side of a heterojunction solar cell by a plating method, the problem that a metal component is diffused from a plating solution into a silicon substrate, or an undesired metal is precipitated due to leakage which is not associated with a short-circuit between transparent electrode layers on the front and the back cannot be solved merely by eliminating a short-circuit between transparent electrode layers on the front and the back.

In view of the above-mentioned problem, an object of the present invention is to improve the productivity and conversion efficiency of a solar cell by forming a back metal electrode using an electroplating method capable of reducing a process cost; and suppressing precipitation of an undesired metal, diffusion of a metal into a silicon substrate, and so on.

Means for Solving the Problems

In the present invention, a plated metal electrode is formed on the back side by electroplating in a state in which a specific insulating region is provided at the peripheral edge on the light-receiving side. According to this configuration, precipitation of an undesired metal due to leakage can be suppressed in electroplating.

In a crystalline silicon-based solar cell according to the present invention, an n-type crystalline silicon substrate having a first principal surface, a second principal surface and a side surface is used. The crystalline silicon-based solar cell includes: an n-type crystalline silicon substrate; a first intrinsic silicon-based thin-film, a p-type silicon-based thin-film, a first transparent electrode layer and a patterned collecting electrode which are sequentially formed on a first principal surface of the n-type crystalline silicon substrate; and a second intrinsic silicon-based thin-film, an n-type silicon-based thin-film, a second transparent electrode layer and a plated metal electrode which are sequentially formed on a second principal surface of the n-type crystalline silicon substrate. The plated metal electrode is formed on the entire region of the second transparent electrode layer.

On the entire first principal surface, the entire second principal surface and the entire region of the side surface of the crystalline silicon substrate, at least one of the first intrinsic silicon-based thin-film and the second intrinsic silicon-based thin-film is formed. In other words, the entire surface of the crystalline silicon substrate is covered with the silicon-based thin-film. The crystalline silicon-based solar cell according to the present invention has an insulating region is provided at the peripheral edge of the first principal surface, wherein the insulating region is freed of a short circuit between the first transparent electrode layer and the second transparent electrode layer.

A method for manufacturing a crystalline silicon-based solar cell according to the present invention includes the steps of: depositing a first intrinsic silicon-based thin-film on the entire region of a first principal surface and the side surface of an n-type crystalline silicon substrate (first intrinsic silicon-based thin-film forming step); depositing a p-type silicon-based thin-film on the first intrinsic silicon-based thin-film (p-type silicon-based thin-film forming step); depositing a first transparent electrode layer on the entire region of the first principal surface except for the peripheral edge thereof (first transparent electrode layer forming step); depositing a second intrinsic silicon-based thin-film on the entire region of a second principal surface and the side surface of the n-type crystalline silicon substrate (second intrinsic silicon-based thin-film forming step); depositing an n-type silicon-based thin-film on the second intrinsic silicon-based thin-film (n-type silicon-based thin-film forming step); and depositing a second transparent electrode layer on the n-type silicon-based thin-film (second transparent electrode layer forming step). Further, after these steps are carried out, a step of forming a plated metal electrode on the entire surface of the second transparent electrode layer by an electroplating method in a state in which the insulating region is provided at the peripheral edge of the first principal surface (plated metal electrode forming step) is carried out.

For example, in the first transparent electrode layer forming step, by performing deposition under a state in which the peripheral edge of the first principal surface is covered with a mask, the first transparent electrode layer is formed on the entire region of the first principal surface except for the peripheral edge thereof. Accordingly, the insulating region can be formed at the peripheral edge of the first principal surface.

In one embodiment of the crystalline silicon-based solar cell according to the present invention, the second transparent electrode layer is also formed on the side surface as well as the entire second principal surface. For example, by performing deposition without using a mask in the second transparent electrode layer forming step, the second transparent electrode layer is formed on the entire surface of the second principal surface and the side surface.

In one embodiment of the crystalline silicon-based solar cell according to the present invention, for example, by performing deposition without using a mask in the p-type silicon-based thin-film forming step and the n-type silicon-based thin-film forming step, the p-type silicon-based thin-film is formed on the entire first principal surface and the side surface, and the n-type silicon-based thin-film is formed on the entire second principal surface and the side surface. In this embodiment, it is preferable that deposition of the p-type silicon-based thin-film is performed before deposition of the n-type silicon-based thin-film. Accordingly, on the side surface of the n-type crystalline silicon substrate, the p-type silicon-based thin-film is situated closer to the n-type crystalline silicon substrate than the n-type silicon-based thin-film. In this case, precipitation of an undesired metal due to leakage is further suppressed.

After deposition of the second transparent electrode layer and before deposition of the plated metal electrode, an underlying metal layer may be formed on the entire surface of the second transparent electrode layer. Here, a plated electrode layer is formed on the underlying metal layer by electroplating.

Effects of the Invention

The crystalline silicon-based solar cell according to the present invention includes a plated metal electrode on the entire surface on the back side, and therefore light that has been transmitted without being absorbed by the crystalline silicon substrate can be reflected by the metal electrode on the back side to improve light utilization efficiency. The plated metal electrode is formed by an electroplating method, and therefore the electrode having a large thickness can be easily formed. Further, electroplating is performed in a state in which a specific insulating region is provided, and therefore precipitation of an undesired metal, diffusion of a metal into the silicon substrate, and so on are suppressed. Thus, according to the present invention, the productivity and conversion efficiency of the solar cell can be improved.

DESCRIPTION OF EMBODIMENT

Figure 1:
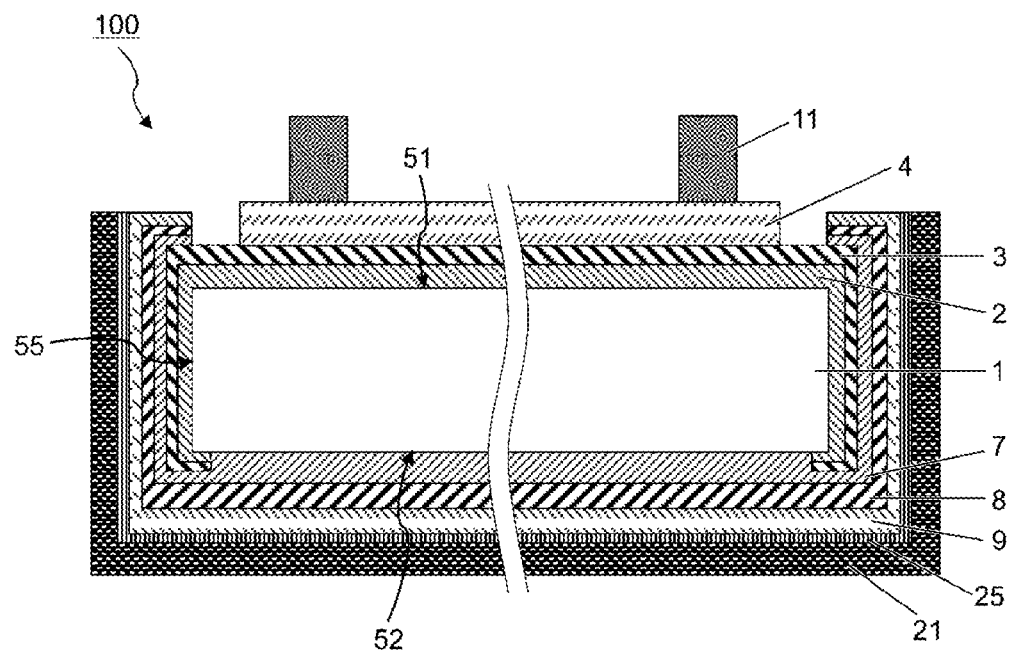
FIG. 1. is a schematic sectional view of a crystalline silicon-based solar cell according to one embodiment of the present invention.

FIG. 1 is a schematic sectional view of a crystalline silicon-based solar cell according to one embodiment of the present invention. An n-type single-crystalline silicon substrate is used in the crystalline silicon-based solar cell of the present invention. The crystalline silicon substrate 1 has first principal surface 51, second principal surface 52 and side surface 55.

The crystalline silicon-based solar cell according to the present invention is so called a heterojunction solar cell, and includes a first intrinsic silicon-based thin-film 2, a p-type silicon-based thin-film 3, a first transparent electrode layer 4 and a patterned collecting electrode 11 on the first principal surface 51 of the n-type crystalline silicon substrate 1; and a second intrinsic silicon-based thin-film 7, an n-type silicon-based thin-film 8, a second transparent electrode layer 9 and a plated metal electrode 21 on the second principal surface 52 of the n-type crystalline silicon substrate 1.

In comparison between holes and electrons, electrons have a smaller effective mass and scattering cross-sectional area, and thus have a larger mobility. Therefore, an n-type single-crystalline silicon substrate is used as the crystalline silicon substrate 1. In the heterojunction solar cell, a strong electric field can be provided to efficiently separate and collect electron-hole pairs when the heterojunction on the light-receiving side, at which light incident to the crystalline silicon substrate is absorbed in the largest amount, is a reverse junction. Thus, when the first principal surface provided with the p-type silicon-based thin-film 3 is a light-receiving surface, conversion efficiency is improved.

In order to enhance a light confinement, the single-crystalline silicon substrate 1 preferably has textured structure (not illustrated in the drawings) in its surface. On the first principal surface of the silicon substrate 1, a first intrinsic silicon-based thin-film 2 and a p-type silicon-based thin-film 3 are formed as silicon-based thin-films. On the second principal surface of the silicon substrate 1, a second intrinsic silicon-based thin-film 7 and an n-type silicon-based thin-film 8 are formed as silicon-based thin-films The intrinsic silicon-based thin-films 2 and 7 are preferably i-type hydrogenated amorphous silicon composed of silicon and hydrogen. When i-type hydrogenated amorphous silicon is deposited on a crystalline silicon substrate, surface passivation can be effectively performed while suppressing diffusion of impurities to the crystalline silicon substrate.

The conductive (p-type or n-type) silicon-based thin-films 3 and 8 may be amorphous silicon-based thin-films, microcrystalline silicon-based thin-films (thin-films containing amorphous silicon and crystalline silicon), and the like. For the silicon-based thin-film, not only silicon but also a silicon-based alloy such as silicon oxide, silicon carbide or silicon nitride can be used. Among them, the conductive silicon-based thin-film is preferably an amorphous silicon thin-film.

On the conductive silicon-based thin-films 3 and 8, transparent electrode layers 4 and 9 are formed, respectively. As the transparent electrode layer, conductive metal oxide such as zinc oxide, indium oxide and tin oxide, or composite metal oxides thereof is used. Among them, indium-based oxides are preferable from the viewpoints of electroconductivity, optical characteristics and long-term reliability, and one having indium tin oxide (ITO) as a main component is especially preferable. The transparent electrode layer may be a single layer or a layered structure composed of multiple layers. Each of the first transparent electrode layer 4 and the second transparent electrode layer 9 preferably has a thickness of 10 nm or more and 140 nm or less, from the viewpoints of transparency, electroconductivity and reduction of light reflection.

In this specification, the wording "as a main component" means that the content is more than 50% by weight, preferably 70% by weight or more, more preferably 90% by weight or more.

As the method for forming the silicon-based thin-films 2, 3, 7 and 8 and the transparent electrode layers 4 and 9, a dry process such as a CVD method, a sputtering method or a vapor deposition method is preferred. In particular, the silicon-based thin-films are formed preferably by a plasma-enhanced CVD method. The method for forming the transparent electrode layers is preferably a physical vapor deposition method such as a sputtering method, a CVD method using a reaction of an organic metal compound with oxygen or water, or the like (MOCVD method).

Although the order of forming these layers is not particularly limited, it is preferable that the the first intrinsic silicon-based thin-film 2 and the p-type silicon-based thin-film 3 are successively deposited using the same deposition apparatus for improving productivity. Similarly, it is preferable that the second intrinsic silicon-Page based thin-film 7 and the n-type silicon-based thin-film 8 are successively deposited. Deposition of the first intrinsic silicon-based thin-film 2 and the p-type silicon-based thin-film 3 on the first principal surface may be performed before or after deposition of the second intrinsic silicon-based thin-film 7 and the n-type silicon-based thin-film 8 on the second principal surface. When deposition of the p-type silicon-based thin-film 3 is performed before deposition of the n-type silicon-based thin-film 8, precipitation of an undesired metal due to leakage during deposition of the plated metal electrode 21 can be reduced.

The transparent electrode layers 4 and 9 may be deposited after deposition of all the silicon-based thin-films 2, 3, 7 and 8; the transparent electrode layer on one principal surface is deposited after deposition of the intrinsic silicon-based thin-film, the conductive silicon-based thin-film, and then the intrinsic silicon-based thin-film, the conductive silicon-based thin-film and the transparent electrode layer may be deposited on the other principal surface. For improving the passivation effect on the side surface of the crystalline silicon substrate, it is preferable that the transparent electrode layers 4 and 9 are deposited after deposition of all the silicon-based thin-films 2, 3, 7 and 8.

For changing the deposition surface in deposition of the silicon-based thin-films 2, 3, 7 and 8 and the transparent electrode layers 4 and 9 on the crystalline silicon substrate 1, the operation of reversing the substrate is required, so that production efficiency may be reduced. Thus, the number of times of changing the deposition surface is preferably as small as possible.

Putting the above-described views together, it is preferable that the intrinsic silicon-based thin-film and the conductive silicon-based thin-film are formed on one principal surface, the deposition surface is then changed to form the intrinsic silicon-based thin-film and the conductive silicon-based thin-film on the other principal surface, the transparent electrode layer is formed on the other principal surface without changing the deposition surface, and the deposition surface is then changed to form the transparent electrode layer on the one principal surface. For example, when deposition of the p-type silicon-based thin-film 3 is performed before deposition of the n-type silicon-based thin-film 8, it is preferable to deposit the first intrinsic silicon-based thin-film 2, the p-type silicon-based thin-film 3, the second intrinsic silicon-based thin-film 7, the n-type silicon-based thin-film 8, the second transparent electrode layer 9 and the first transparent electrode layer 4 in this order.

Figure 2:
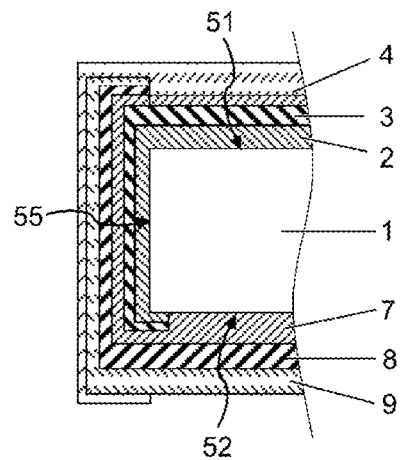
FIG. 2 is a schematic sectional view showing a deposition state in the vicinity of the peripheral portion of the crystalline silicon substrate after the silicon-based thin-films and the transparent electrode layers are formed.

FIG. 2 is a sectional view schematically showing a configuration in the vicinity of the peripheral portion of a crystalline silicon substrate when the first intrinsic silicon-based thin-film 2 and the p-type silicon-based thin-film 3 are formed on the first principal surface of the n-type crystalline silicon substrate 1, the second intrinsic silicon-based thin-film 7 and the n-type silicon-based thin-film 8 are then formed on the second principal surface, and the second transparent electrode layer 9 and the first transparent electrode layer 4 are then formed. In this specification, the "peripheral edge" refers to a peripheral end of the principal surface, and a region extending over a predetermined distance (e.g., several tens of micrometers to several millimeters) from the peripheral end. The "peripheral portion" refers to a region including the peripheral edges of the first principal surface and the second principal surface, and the side surface.

When the above-mentioned layers are formed by a dry process such as a CVD method or a sputtering method without using a mask, the silicon-based thin-films 7 and 8 and the second transparent electrode layer 9 formed on the second principal surface of the crystalline silicon substrate 1 are also formed on the side surface of the crystalline silicon substrate 1 and the peripheral edge of the first principal surface by wraparound during deposition. The silicon-based thin-films 2 and 3 and the first transparent electrode layer 4 formed on the first principal surface of the crystalline silicon substrate 1 are also formed on the side surface of the silicon substrate 1 and the peripheral edge of the second principal surface by wraparound during deposition. Thus, in the form shown in FIG. 2, the first transparent electrode layer 4 and the second transparent electrode layer 9 are short-circuited with each other.

When the plated metal electrode 21 is formed on the second transparent electrode layer 9 by an electroplating method in a state in which the first transparent electrode layer 4 and the second transparent electrode layer 9 are short-circuited with each other as described above, a metal is precipitated on the first transparent electrode layer 4 on the first principal surface (light-receiving surface) side. Thus, it is necessary to form the plated metal electrode on the second principal surface in a state in which the first transparent electrode layer 4 and the second transparent electrode layer 9 are not short-circuited with each other.

In production of heterojunction solar cells, a method is known in which deposition is performed under a state in which the peripheral edge of a substrate is covered with a mask or the like, so that deposition on the peripheral edge and the side surface is prevented to avoid generation of a short-circuit between the front and the back, or a short-circuit portion is eliminated by etching processing or the like. In the present invention, either of the methods can be employed.

In the present invention, the plated metal electrode 21 is formed by electroplating in a state in which an insulating region on which neither of the first transparent electrode layer and the second transparent electrode layer is formed. For suppressing precipitation of a metal due to leakage, it is necessary to form a silicon-based thin-film on the insulating region so that the silicon substrate is not exposed. Such an insulating region can be easily formed, and therefore in the present invention, it is preferable that a mask is used during formation of the transparent electrode layer to avoid generation of a short-circuit between the front and the back.

In the present invention, the plated metal electrode is formed on the second principal surface in a state in which an insulating region is provided at the peripheral edge of the first principal surface, wherein, on the insulating region, the silicon-based thin-film is formed and neither of the first transparent electrode layer and the second transparent electrode layer is formed. FIGS. 3A to 3D are schematic sectional views each showing a deposition state in the vicinity of peripheral portion of the substrate before formation of the plated metal electrode in the process of manufacturing the crystalline silicon solar cell according to the present invention. In any of these forms, at least the first intrinsic silicon-based thin-film 2 is provided on the insulating regions 41 to 44 at the peripheral edge of the first principal surface, and neither of the first transparent electrode layer 4 and the second transparent electrode layer 9 is provided on the insulation regions. Specifically, before formation of the plated metal electrode layer, the entire first principal surface, the entire second principal surface and the side surface of the crystalline silicon substrate 1 are covered with the silicon-based thin-film, and the insulating region freed of a short-circuit between the first transparent electrode layer and the second transparent electrode layer is formed at the peripheral edge of the first principal surface.

Figure 3A:
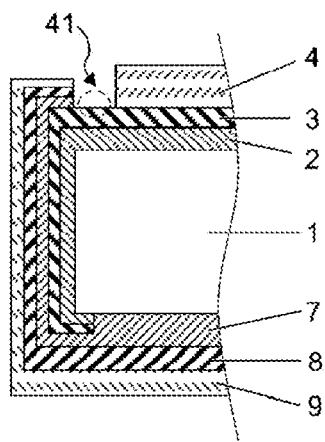
FIGS. 3A to 3D are schematic sectional views each showing a deposition state in the vicinity of the peripheral portion of the crystalline silicon substrate (before formation of the plated metal electrode) in the process of manufacturing the crystalline silicon solar cell according to the present invention.

In FIG. 3A, the first intrinsic silicon-based thin-film 2 and the p-type silicon-based thin-film 3 are formed on the entire first principal surface and the side surface, and the second intrinsic silicon-based thin-film 7, the n-type silicon-based thin-film 8 and the second transparent electrode layer 9 are formed on the entire second principal surface and the side surface. The first transparent electrode layer 4 is formed on the entire region of the first principal surface except for the peripheral edge thereof, and is not formed on the side surface. In the form shown in FIG. 3A, an insulating region 41, on which neither of the first transparent electrode layer 4 and the second transparent electrode layer 9 is formed, is provided at the peripheral edge of the first principal surface. The insulating region 41 in this form can be produced, for example, in a case where deposition of the silicon-based thin-films 2, 3, 7 and 8 and the second transparent electrode layer 9 are performed without using a mask, and deposition of the first transparent electrode layer 4 is performed under a state in which the peripheral edge of the first principal surface is covered with a mask.

Figure 3B:
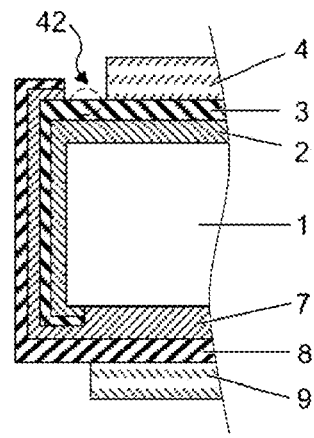

Further, when a mask is used during deposition of the second transparent electrode layer 9, i.e., deposition is performed under a state in which the peripheral edge of the second principal surface is covered with a mask, an insulating region 42 can be formed at the peripheral edge of the first principal surface as shown in FIG. 3B. In the forms shown in FIGS. 3C and 3D, insulating regions 43 and 44, on which the intrinsic silicon-based thin-film 2 is formed and neither of the transparent electrode layer and the conductive silicon-based thin-film is formed, is provided at the peripheral edge of the first principal surface. The insulating regions 43 and 44 in these forms can be produced in a case where deposition of the p-type silicon-based thin-film is performed under a state in which the peripheral edge of the first principal surface is covered with a mask.

When an insulating region, on which neither of transparent electrode layers 4 and 9 is formed, is provided at the peripheral edge of the first principal surface, precipitation of a metal on the first principal surface (on the first transparent electrode layer 4) due to a short-circuit of the transparent electrode layer can be prevented. Further, at least the intrinsic silicon-based thin-film 2 is formed on the insulating region, and therefore precipitation of an undesired metal due to leakage is suppressed.

Figure 4A:
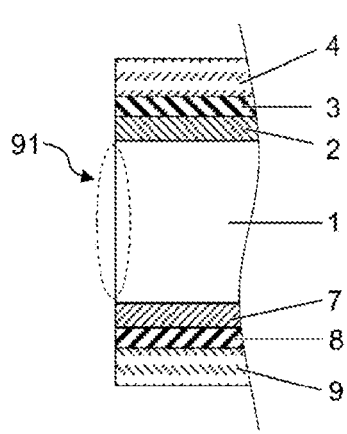
FIGS. 4A to 4E are schematic sectional views each showing a deposition state in the vicinity of the peripheral portion of the crystalline silicon substrate (before formation of the plated metal electrode) in the process of manufacturing the crystalline silicon solar cell according to comparative example.
Figure 4B:
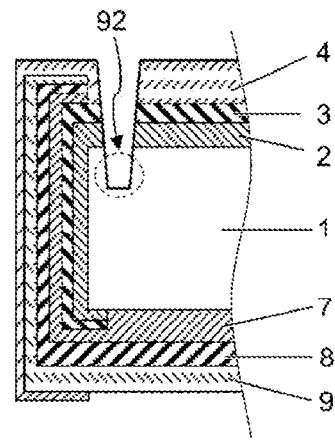

Precipitation of a metal due to leakage in formation of a metal electrode on the second principal surface by electroplating will be described with reference to FIGS. 4A to 4E associated with a comparative example. Examples of the method for eliminating leakage between the first transparent electrode layer and the second transparent electrode layer include a method in which the peripheral portion of a substrate is cleaved and removed by laser irradiation. In this case, the side surface of the n-type crystalline silicon substrate 1 is exposed at an insulating region 91, as shown in FIG. 4A. When the transparent electrode layer 4 is removed by laser irradiation to form an insulating region, it is difficult to remove only the transparent electrode layer 4. Thus, as shown in FIG. 4B, a groove extends to the silicon substrate 1, so that in an insulating region 92, the n-type crystalline silicon substrate 1 is exposed.

When electroplating is performed by applying a current to the second transparent electrode layer 9 in a state in which the n-type crystalline silicon substrate 1 is exposed as described above, electrons are supplied to the n-type crystalline silicon substrate 1 via the n-type silicon-based thin-film 8 from the second transparent electrode layer 9. Therefore, on the insulating regions 91 and 92 that are exposed portions of the n-type crystalline silicon substrate 1, a plated metal is precipitated. Precipitation of an undesired metal as described above causes generation of a new short-circuit and leakage pass to reduce the fill factor and open circuit voltage of the solar cell. When a metal is precipitated on the first principal surface, the metal causes shading to reduce the amount of light taken into the n-type crystalline silicon substrate 1 from the light-receiving surface (first principal surface), so that the current density of the solar cell is decreased. When the exposed portion of the silicon substrate comes into contact with a plating solution in electroplating, metal ions in the plating solution are diffused into the silicon substrate to deteriorate conversion characteristics.

Figure 4C:
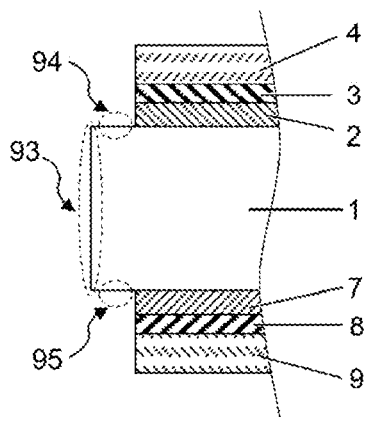
Figure 4D:
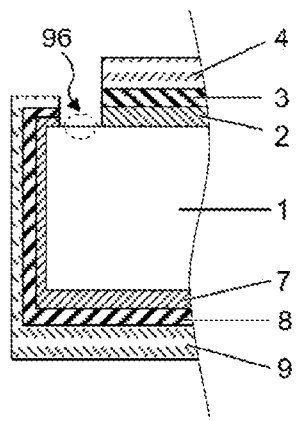

In FIG. 4C, insulating regions 93, 94 and 95 at which the silicon substrate is exposed are formed on the side surface, on the peripheral edge of the first principal surface and on the peripheral edge of the second principal surface. This form can be provided in a case where the silicon-based thin-films 2 and 3 and the transparent electrode layer 4 are deposited under a state in which the peripheral edge of the first principal surface is covered, and the silicon-based thin-films 7 and 8 and the transparent electrode layer 9 are deposited under a state in which the peripheral edge of the second principal surface is covered. In FIG. 4D, an insulating region 96 at which the silicon substrate is exposed is provided on the peripheral edge of the first principal surface. The insulating region 96 in this form can be produced in a case where the silicon-based thin-films 2 and 3 and the transparent electrode layer 4 are deposited under a state in which the peripheral edge of the first principal surface is covered, and a mask is not used during formation of the silicon-based thin-films 7 and 8 and the transparent electrode layer 9 on the second principal surface. In these forms, precipitation of a metal on the insulating region and diffusion of metal ions in the plating solution into the silicon substrate occur when electroplating is performed by applying a current to the second transparent electrode layer 9.

Figure 4E:
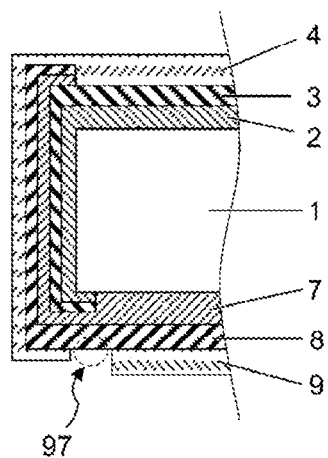

In FIG. 4E, an insulating region 97, on which the second intrinsic silicon-based thin-film 7 and the n-type silicon-based thin-film 8 are formed and the transparent electrode layer 9 is not formed, is provided at the peripheral edge of the second principal surface. The insulating region 97 in this form can be produced in a case where formation of the silicon-based thin-films 2 and 3 and the transparent electrode layer 4 on the first principal surface and formation of the silicon-based thin-films 7 and 8 on the second principal surface are performed without using mask, and the second transparent electrode layer 9 is formed under a state in which the peripheral edge of the second principal surface is covered with a mask. When electroplating is performed by applying a current to the second transparent electrode layer 9 in a state in which an insulating region is provided only on the second principal surface and an insulating region is not provided on the first principal surface, electrons are supplied to the insulating region 97 and the first transparent electrode layer 4 via the n-type silicon-based thin-film 8 from the second transparent electrode layer 9, so that a plated metal is precipitated thereon. When precipitation of the plated metal on the insulating region 97 proceeds, the second transparent electrode layer 9 and the first transparent electrode layer 4 are connected via the precipitated metal to cause a short-circuit between the transparent electrode layers on the front and the back.

On the other hand, in FIGS. 3A to 3D, the silicon-based thin-film is formed on the peripheral edge of the first principal surface, and insulating regions 41 to 44, on which neither of the transparent electrode layers 4 and 9 is formed, are provided on the first principal surface. It can be understood that, in these forms, precipitation of a metal on the insulating region due to leakage does not occur even when electroplating is performed by applying a current to the second transparent electrode layer 9. Since the side surface of the silicon substrate 1 is covered with the silicon-based thin-film, ingress of moisture etc. from the side surface is suppressed in practical use of the solar cell.

Figure 5:
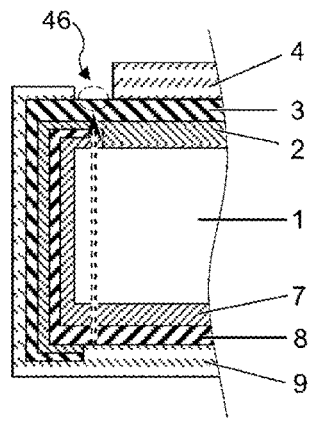
FIG. 5 is a schematic sectional view showing a deposition state in the vicinity of the peripheral portion of the crystalline silicon substrate (before formation of the plated metal electrode) in the process of manufacturing the crystalline silicon solar cell according to the present invention, where deposition of the n-type silicon-based thin-film is performed before deposition of the p-type silicon-based thin-film.

FIGS. 3A to 3D show a form in which deposition of the p-type silicon-based thin-film 3 is performed before deposition of the n-type silicon-based thin-film 8 so that the p-type silicon-based thin-film 3 is situated closer to the n-type crystalline silicon substrate 1 than the n-type silicon-based thin-film 8 on the side surface of the n-type crystalline silicon substrate 1. On the other hand, deposition of the n-type silicon-based thin-film 8 may be performed before deposition of the p-type silicon-based thin-film 3 so that the n-type silicon-based thin-film 8 is situated closer to the n-type crystalline silicon substrate 1 than the p-type silicon-based thin-film 3 as shown in FIG. 5. In this form, however, a leakage pass exists at a n/n/p junction portion composed of the n-type silicon-based thin-film 8, the n-type crystalline silicon substrate 1 and the p-type silicon-based thin-film 3 as shown with a dashed line arrow in FIG. 5, and therefore a plated metal may be slightly precipitated at the exposed portion of the p-type silicon-based thin-film 3 of the insulating region 46 to cause shading etc. However, the precipitated metal on the silicon-based thin-film may be removed by air blowing etc., and therefore influences of the precipitated metal are smaller than each of the forms in FIGS. 4A to 4D.

When an insulating region, on which the silicon-based thin-film is formed and neither of the first transparent electrode layer 4 and the second transparent electrode layer 9 is formed, is provided at the peripheral edge of the first principal surface, precipitation of an undesired metal during deposition of the plated metal electrode 21 can be suppressed as described above. Particularly, when deposition of the p-type silicon-based thin-film 3 is performed before deposition of the n-type silicon-based thin-film 8 as shown in FIGS. 3A to 3D, the effect of suppressing precipitation of a plated metal due to leakage is high.

Figure 3C:
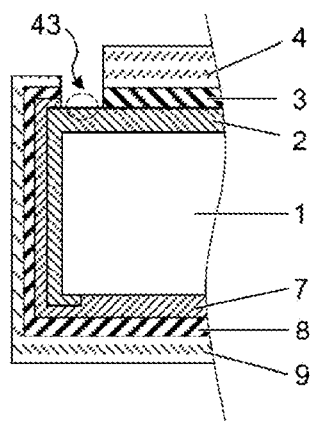
Figure 3D:
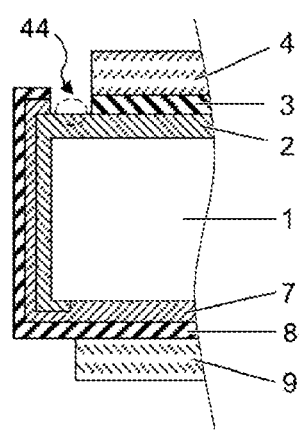

In particular, when a mask is not used during deposition of the second transparent electrode layer 9, and thus the second transparent electrode layer 9 is also formed on the entire second principal surface and the side surface as shown in FIGS. 3A and 3C, the silicon-based thin-film is protected from a plating solution by a conductive oxide that forms the transparent electrode layer. Thus, deterioration of characteristics due to alloying of silicon, diffusion of a metal component in the plating solution into the silicon substrate, and so on can be suppressed. Further, on the side surface of the substrate, the plated metal electrode 21 is formed by electroplating in addition to the silicon-based thin-film and the second transparent electrode layer 9, and therefore ingress of moisture etc. from the side surface is further suppressed in practical use of the solar cell. Since it is not required to use a mask during deposition of the second transparent electrode layer 9, steps for covering with the mask and alignment of the mask are unnecessary, so that production efficiency can be improved. Further, the second transparent electrode layer is also formed on the peripheral edge of the second principal surface, and therefore carrier collection efficiency on the second principal surface is improved.

In particular, when a mask is not used during deposition of the p-type silicon-based thin-film 3, and thus the p-type silicon-based thin-film 3 is formed on the side surface as well as on the entire first principal surface as shown in FIG. 3A, the first intrinsic silicon-based thin-film 2 and the p-type silicon-based thin-film 3 can be successively deposition, and therefore production efficiency can be further improved. On the other hand, when the deposition of the p-type silicon-based thin-film 3 is performed under a state in which the peripheral edge of the first principal surface is covered with a mask, leakage between the p-type silicon-based thin-film 3 and the n-type silicon-based thin-film 8 can be prevented as shown in FIG. 3C, and therefore conversion efficiency can be improved.

As described above, the silicon-based thin-films 2, 3, 7 and 8 and the transparent electrode layers 4 and 9 are formed on the n-type crystalline silicon substrate 1, and the plated metal electrode 21 is then formed on the second transparent electrode layer 9 by electroplating. The plated metal electrode 21 is formed on the entire second principal surface, and thus light which has arrived at the second principal surface without being absorbed by the silicon substrate is reflected to reenter into the silicon substrate, so that light utilization efficiency can be improved. Particularly, since silicon has a small light absorption coefficient on a near-infrared to long wavelength side, light utilization efficiency is improved by a plated metal electrode using a material with high reflectivity to light having a wavelength in a near-infrared to infrared range.

The plated metal electrode 21 is formed on the second transparent electrode layer 9 mainly composed of a conductive metal oxide, so that adhesion between the silicon-based thin-film and the electrode is improved, and the contact resistance is reduced. Since the second transparent electrode layer 9 is provided, diffusion of a metal component to the silicon-based thin-film and the silicon substrate from the plated metal electrode 21 and an underlying metal layer 25 is suppressed, and therefore conversion characteristics can be improved.

Figure 6:
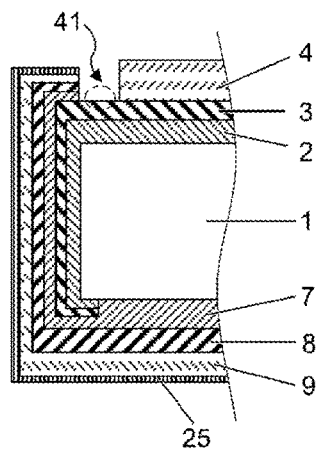
FIG. 6 is a schematic sectional view showing a deposition state in the vicinity of the peripheral portion of the crystalline silicon substrate (before formation of the plated metal electrode) in the process of manufacturing the crystalline silicon solar cell according to the present invention, where an underlying metal layer is formed on the transparent electrode layer.

In the present invention, the underlying metal layer 25 may be formed on the second transparent electrode layer 9 before formation of the plated metal electrode as shown in FIG. 6. When the underlying metal layer 25 is formed on the surface of the second transparent electrode layer 9, the conductivity of the surface can be enhanced to improve efficiency of electroplating.

Further, the second transparent electrode layer 9 can be protected from a plating solution by the underlying metal layer 25. Particularly, when the second transparent electrode layer 9 is made of an amorphous conductive metal oxide, it has low durability to the plating solution, and therefore it is preferable that the underlying metal layer 25 is formed for preventing erosion of the second transparent electrode layer 9 by the plating solution.

As a metallic material that forms the underlying metal layer 25, copper, nickel, tin, aluminum, chromium, silver, gold, zinc, lead, palladium or the like, or an alloy thereof can be used. Although the method for forming the underlying metal layer 25 is not particularly limited, a dry process such as a sputtering method or a vapor deposition method, or electroless plating is preferable for efficiently covering the entire surface of the second transparent electrode layer 9. When a sputtering method is employed, the second transparent electrode layer 9 and the underlying metal layer 25 can be also successively formed.

Although the thickness of the underlying metal layer 25 is not particularly limited, it is preferably 200 nm or less, more preferably 100 nm or less, further preferably 60 nm or less from the viewpoint of productivity. The thickness of the underlying metal layer 25 is preferably 50% or less, more preferably 30% or less, further preferably 20% or less of the thickness of the plated metal electrode. On the other hand, for imparting high conductivity to the underlying metal layer itself, and preventing exposure of the second transparent electrode layer by pinholes or the like, the the thickness of the underlying metal layer 25 is preferably 10 nm or more, more preferably 20 nm or more, further preferably 30 nm or more.

Material of the plated metal electrode 21 is not particularly limited as long as it is a material that can be deposited by a plating method. For example, copper, nickel, tin, aluminum, chromium, silver, gold, zinc, lead, palladium, and alloys thereof may be precipitated as the plated metal electrode 21. Among them, copper or an alloy including copper as a main component is preferable for the metal that forms the plated metal electrode due to high precipitation rate in electroplating, high electroconductivity and low material cost.

Formation of the plated metal electrode is performed by immersing an anode in a plating solution, and applying a voltage between the anode and the second transparent electrode layer with the second transparent electrode layer 9 (or the underlying metal layer 25 formed on the surface thereof) brought into contact with the plating solution. A plated metal electrode including copper as a main component can be formed by, for example, an acidic copper plating. A plating solution used for acidic copper plating contains copper ions, and a solution of known composition, which includes copper sulfate, sulfuric acid and water as main components, can be used. Copper can be precipitated on the second transparent electrode layer 9 by causing a current of 0.1 to 10 A/dm$^2$ to pass the plating solution. The suitable plating time is appropriately set according to the area of the electrode, the current density, cathode current efficiency, desired thickness and so on.

The plated metal electrode may be a stack of a plurality of layers. For example, by forming a first plating layer made of a material having a high electroconductivity, such as copper, and then forming a metal layer that has higher chemical stability than the first plated metal layer, a back metal electrode having low resistance and being excellent in chemical stability can be formed.

It is preferable to remove a plating solution remaining on the surface after formation of the plated metal electrode by electroplating. By removing the plating solution, a metal precipitated on the surfaces of the exposed portions of the intrinsic silicon-based thin-film 2 and the p-type silicon-based thin-film (insulating regions 41 to 44 and 46 of the peripheral edge of the first principal surface; see FIGS. 3A to 3D, FIG. 5 and FIG. 6), the end surfaces of the second transparent electrode layer 9, and so on can also be removed together. Removal of the plating solution can be performed by, for example, a method in which plating solution remaining on the surface of the substrate taken out from a plating tank is removed by air blow-type air washing, rinsing is then carried out, and a washing fluid is blown off by air blow. By reducing the amount of plating solution remaining on the surface of the substrate by carrying out air washing before rinsing, the amount of the plating solution brought in at the time of rinsing can be decreased. Therefore, the amount of washing fluid required for rinsing can be decreased, and time and effort for waste liquid treatment associated with rinsing can also be reduced, so that environmental burdens and expenses resulting from washing are reduced, and productivity of the solar cell can be improved.

The patterned collecting electrode 11 is formed on the first transparent electrode layer 4 of the first principal surface. The method for forming the patterned collecting electrode is not particularly limited, and the patterned collecting electrode can be formed by a plating method, a printing method such as inkjet printing or screen printing, a conductor bonding method or the like. For example, in the screen printing method, a process in which a conductive paste composed of metal particles and a resin binder is applied by screen printing is preferably used.

In the plating method, a patterned collecting electrode can be formed by plating under a state in which the first transparent electrode layer is covered with a resist having an opening corresponding to the pattern shape of the collecting electrode. Alternatively, as disclosed in Patent Document 1 (WO 2013/161127) etc., the patterned collecting electrode 11 may be formed by depositing a metal with an opening section of an insulating layer as an origination point for plating, the insulating layer being formed on the underlying metal layer. When the patterned collecting electrode 11 is formed by electroplating, it is preferable that electroplating is performed in a state in which the first transparent electrode layer and the second transparent electrode layer are not short-circuited (an insulating region is formed as described above) for suppressing precipitation of an undesired metal on the side surface and the second principal surface.

Formation of the patterned collecting electrode 11 on the first principal surface may be performed before or after formation of the plated metal electrode 21 on the second principal surface. When the patterned collecting electrode 11 is formed by electroplating, formation of the patterned collecting electrode 11 can be performed simultaneously with formation of the plated metal electrode 21. For example, by supplying electricity to each of the first principal surface and the second principal surface in a state in which the first transparent electrode layer and the second transparent electrode layer are not short-circuited, the plated metal layer 21 and the patterned collecting electrode can be simultaneously formed. According to this method, the number of steps of forming an electrode layer by plating can be reduced, so that productivity can be improved.

Figure 7:
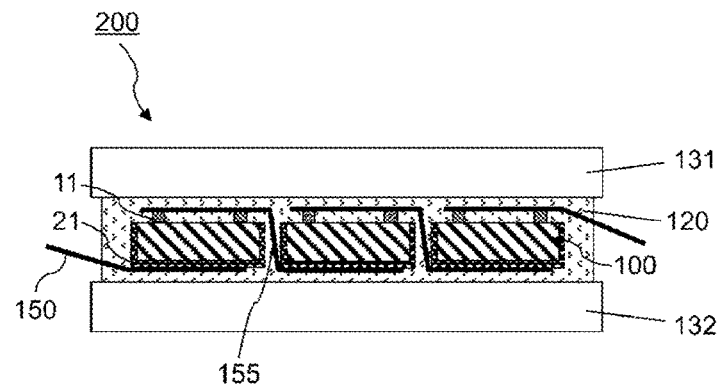
FIG. 7 is a schematic sectional view of a solar cell module according to one embodiment.

Preferably, the crystalline silicon-based solar cell manufactured in the manner described above is modularized for practical use. FIG. 7 is a schematic sectional view showing a solar cell module of one embodiment. The solar cell module includes a wiring member 150 for electrically connecting a solar cell to an external circuit. Generally, in the solar cell module, a plurality of solar cells 100 are electrically connected via an interconnector 155 as shown in FIG. 7. In preparation of a solar cell module in which a plurality of solar cells are connected, a solar cell string in which a plurality of solar cells 100 are mutually connected via the interconnector 155 is prepared. When a plurality of solar cells are connected in series, the collecting electrode 11 of one solar cell and the plated metal layer 21 of the adjacent solar cell are connected via the interconnector 155. The wiring member 150 is connected to solar cells 100 at both ends, which form the solar cell string. The electrode of the solar cell and the wiring member are connected via, for example, an appropriate adhesive (not illustrated).

The solar cell 100 is sandwiched between protective materials 131 and 132 with a sealing material 120 interposed between the solar cell 100 and the protective materials 131 and 132, so that a solar cell module is formed. For example, the protective materials 131 and 132 are arranged on the light-receiving side and the back side, respectively, of the solar cell 100 with the sealing material interposed therebetween, so that a laminated body is obtained, and thereafter the laminated body is heated under a predetermined condition, whereby the sealing material 120 is cured to perform sealing. Then, an Al frame (not illustrated) etc. is attached to prepare the solar cell module.

As the protective material 131 on the light-receiving side, a material having translucency and water impermeability such as a glass, a transparent plastic, or the like can be used. As the protective material 132 on the back side, a resin film such as PET film, a laminated film having a structure with an Al foil sandwiched by resin films, or the like can be used. The sealing material 120 seals the solar cell 100 between the protective materials 131 and 132 on the light receiving surface and the back surface. As the sealing material, a transparent resin such as EVA, EEA, PVB, silicone, urethane, acryl, epoxy, or the like can be used.

The solar cell is sealed in the above-described manner to suppress ingress of external moisture etc. into the solar cell, so that the long-term reliability of the solar cell module can be improved. The protective materials 131 and 132 are adhesively stacked on the light-receiving side and the back side, respectively, of the solar cell 100 with the sealing material 120 interposed therebetween, whereas the side surface of the solar cell is only protected by the sealing material. Thus, in the solar cell module, external moisture etc. tends to easily come into contact with the solar cell from the side surface. In the solar cell according to the present invention, the silicon-based thin-film is also formed on the side surface of the crystalline silicon substrate 1, and therefore ingress of moisture etc. into the crystalline silicon substrate from the side surface of the solar cell is suppressed. Particularly, when the plated metal electrode 21 is also formed on the side surface of the solar cell as shown in FIG. 7, ingress of moisture etc. from the side surface can be further suppressed, so that the long-term reliability of the solar cell module can be further improved.

DESCRIPTION OF REFERENCE CHARACTERS

1: n-type crystalline silicon substrate
2, 7: intrinsic silicon-based thin-film
3: p-type silicon-based thin-film
8: n-type silicon-based thin-film
4, 9: transparent electrode layer
21: plated metal electrode
25: underlying metal layer
11: patterned collecting electrode
41 to 44: insulating region
100: solar cell
120: sealing material
131,132: protective material
150: wiring member
155: interconnector
200: solar cell module

The invention claimed is:
1. A method for manufacturing a crystalline silicon-based solar cell, the crystalline silicon-based solar cell comprising:

an n-type crystalline silicon substrate having a first principal surface, a second principal surface and a side surface; a first intrinsic silicon-based thin-film, a p-type silicon-based thin-film, a first transparent electrode layer and a patterned collecting electrode which are sequentially formed on the first principal surface of the n-type crystalline silicon substrate; and a second intrinsic silicon-based thin-film, an n-type silicon-based thin-film, a second transparent electrode layer and a plated metal electrode which are sequentially formed on the second principal surface of the n-type crystalline silicon substrate, the method comprising:
- a first intrinsic silicon-based thin-film forming step of depositing the first intrinsic silicon-based thin-film on an entire region of the first principal surface and the side surface of the n-type crystalline silicon substrate;
- a p-type silicon-based thin-film forming step of depositing the p-type silicon-based thin-film on the first intrinsic silicon-based thin-film;
- a first transparent electrode layer forming step of depositing the first transparent electrode layer on the entire region of the first principal surface except for a peripheral edge thereof;
- a second intrinsic silicon-based thin-film forming step of depositing the second intrinsic silicon-based thin-film on an entire region of the second principal surface and the side surface of the n-type crystalline silicon substrate;
- an n-type silicon-based thin-film forming step of depositing the n-type silicon-based thin-film on the second intrinsic silicon-based thin-film; and
- a second transparent electrode layer forming step of depositing the second transparent electrode layer on the n-type silicon-based thin-film, wherein
- a plated metal electrode forming step is further carried out after each of the above steps is carried out and in a state in which an insulating region is provided on the peripheral edge of the first principal surface, the insulating region being freed either of the first transparent electrode layer and the second transparent electrode layer, wherein in the plated metal electrode forming step, the plated metal electrode is formed on an entire surface of the second transparent electrode layer by an electroplating method, in the first transparent electrode layer forming step, deposition is performed under a state in which the peripheral edge of the first principal surface is covered with a mask, thereby the first transparent electrode layer is formed on the entire region of the first principal surface except for the peripheral edge thereof, and in the second transparent electrode layer forming step, deposition is performed without using the mask, thereby the second transparent electrode layer is formed on the entire region of the second principal surface and the side surface.

2. The method for manufacturing the crystalline silicon-based solar cell according to claim 1, wherein
in the p-type silicon-based thin-film forming step, deposition is performed without using the mask, thereby the p-type silicon-based thin-film is formed on an entire first principal surface and the side surface, and
in the n-type silicon-based thin-film forming step, deposition is performed without using the mask, thereby the n-type silicon-based thin-film is formed on the entire second principal surface and the side surface.

3. The method for manufacturing the crystalline silicon-based solar cell according to claim 2, wherein the p-type silicon-based thin-film forming step is carried out before the n-type silicon-based thin-film forming step.

4. The method for manufacturing the crystalline silicon-based solar cell according to claim 1, wherein
after the second transparent electrode layer forming step, an underlying metal layer is formed on the entire surface of the second transparent electrode layer before the plated metal electrode forming step, and
the plated metal electrode is formed on the underlying metal layer in the plated metal electrode forming step.

* * * * *